United States Patent [19]

Shiota

[11] Patent Number: 5,710,994
[45] Date of Patent: Jan. 20, 1998

[54] SYNTHESIZED TYPE RECEIVER WITH PLL

[75] Inventor: Shinichi Shiota, Tokyo, Japan

[73] Assignee: Sony Corporation, Tokyo, Japan

[21] Appl. No.: 697,781

[22] Filed: Aug. 29, 1996

[30] Foreign Application Priority Data

Sep. 6, 1995 [JP] Japan ................................ 7-254707
Sep. 13, 1995 [JP] Japan ................................ 7-260880

[51] Int. Cl.[6] ........................................................ H04B 1/18
[52] U.S. Cl. .................. 455/260; 455/165.1; 455/183.1; 455/184.1; 455/186.1
[58] Field of Search .......................... 455/186.1, 185.1, 455/186.2, 184.1, 179.1, 183.1, 183.2, 166.1, 166.2, 227, 161.1, 161.2, 161.3, 165.1, 158.1, 154.1, 260, 180.3, 257, 256, 255

[56] References Cited

U.S. PATENT DOCUMENTS

| | | | |
|---|---|---|---|
| 4,236,251 | 11/1980 | Ohgishi et al. | 455/186.1 |
| 5,086,511 | 2/1992 | Kobayashi et al. | 455/186.1 |
| 5,101,508 | 3/1992 | Owaki | 455/186.1 |
| 5,152,011 | 9/1992 | Schwob | 455/161.2 |
| 5,161,253 | 11/1992 | Hirano | 455/166.1 |

*Primary Examiner*—Reinhard J. Eisenzopf
*Assistant Examiner*—Doris To
*Attorney, Agent, or Firm*—Jay H. Maioli

[57] ABSTRACT

A synthesizer type receiver where frequency conversion of a received signal is performed by the use of a signal formed in a PLL, and the signal frequency is changed by changing the frequency division ratio of a variable frequency divider in the PLL to thereby change the received frequency. The receiver comprises a detector for detecting reception of a broadcast wave signal; a memory where data areas correspond respectively to a plurality of station selector keys; and a control unit having a data table with a data section relative to frequencies of broadcasting stations receivable in divided areas of the whole area where the receiver is to be used. In a preset mode, the reception frequency band is scanned by changing the frequency of the signal through change of the frequency division ratio, and when the reception frequency at the time of detection of the broadcast wave signal by the detector during the scan is included in the frequency data stored in any preselected divided area, the data relative to the reception frequency is stored in the data area of the memory, and the broadcasting station being currently received is preset in the station selector key corresponding to the data stored area in accordance with the storage.

4 Claims, 6 Drawing Sheets

FIG. 4

| AREA NAME AN | STATION NAME SN | FREQUENCY DIVISION RATIO N (FREQUENCY [MHz]) |
|---|---|---|
| HOKKAIDO | NHK SAPPORO<br>. . . | 745 (85.2)<br>. . . |
| AOMORI | . . . | . . . |
| ≈ | ≈ | ≈ |
| SAITAMA | NHK URAWA<br>. . . | 744 (85.1)<br>. . . |
| TOKYO | UNIV. OF AIR<br>FM-FUJI<br>TOKYO FM<br>FM-FUJI<br>J-WAVE<br>NHK YOKOHAMA<br>NHK TOKYO<br>FM-FUJI<br>FM YOKOHAMA | 664 (77.1)<br>679 (78.6)<br>693 (80.0)<br>698 (80.5)<br>706 (81.3)<br>712 (81.9)<br>718 (82.5)<br>723 (83.0)<br>740 (84.7) |
| ≈ | ≈ | ≈ |
| OKINAWA | . . . | . . . |

DTBL

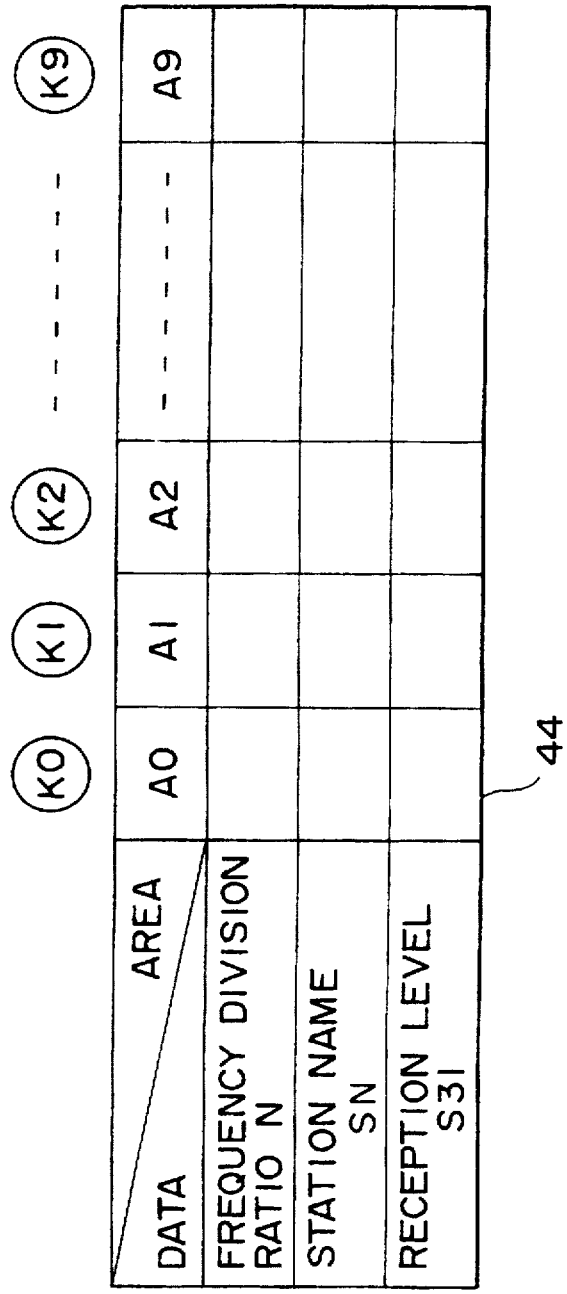

FIG. 6A

| A0 | FM-A |
|----|------|
| A1 | FM-B |
| A2 | FM-C |
| A3 | XX-1 |
| A4 | XX-2 |
| A5 |      |
| A6 |      |
| A7 |      |
| A8 |      |
| A9 |      |

| A0 | FM-A |
|----|------|
| A1 | FM-B |
| A2 | FM-C |
| A3 |      |
| A4 | XX-1 |
| A5 | XX-2 |
| A6 |      |
| A7 |      |
| A8 |      |
| A9 |      |

DATA SHIFT

FIG. 6C

| A0 | FM-A |
|----|------|
| A1 | FM-B |
| A2 | FM-C |
| A3 | FM-D |
| A4 | XX-1 |
| A5 | XX-2 |
| A6 |      |
| A7 |      |
| A8 |      |
| A9 |      |

DATA REGISTER
(T = 6)
(R = 4)

FIG. 6D

| A0 | FM-A |
|----|------|
| A1 | FM-B |
| A2 | FM-C |
| A3 | XX-1 |
| A4 | XX-2 |
| A5 | XX-3 |
| A6 |      |
| A7 |      |
| A8 |      |
| A9 |      |

FIG. 6E

| A0 | FM-A |
|----|------|
| A1 | FM-B |
| A2 | FM-C |
| A3 | FM-D |
| A4 | FM-E |
| A5 | FM-F |
| A6 | FM-G |
| A7 | XX-1 |
| A8 | XX-2 |
| A9 | XX-3 |

FIG. 6F

| A0 | FM-A |
|----|------|
| A1 | FM-B |
| A2 | FM-C |
| A3 | FM-D |
| A4 | FM-E |
| A5 | FM-F |
| A6 | FM-G |
| A7 |      |
| A8 | XX-1 |
| A9 | XX-2 |

SYNTHESIZED TYPE RECEIVER WITH PLL

BACKGROUND OF THE INVENTION

The present invention relates to a synthesizer type receiver having a preset function.

Generally in a synthesizer type receiver using a PLL (phase-locked loop), it is possible to preset desired reception frequencies in station selector keys, so that when one of plural station selector keys is depressed, a broadcasting station of the frequency preset in the depressed key can be selectively received.

In this case, such preset is achieved by previously writing data of desired reception frequencies, e.g., frequency division ratios of a variable frequency divider in the PLL, in addresses of a memory corresponding respectively to the station selector keys. And selection of a desired station is realized by first reading out the frequency division ratio from the address corresponding to the depressed station selector key and then setting the read ratio in the variable frequency divider.

As one method for writing frequency division ratios in a preset memory, there is known a method termed an area call. According to this method, Japan for example is divided into some areas, and upon selection of any desired area, the data of frequencies receivable in that area are read out from a data base in a ROM and then are written in the preset memory.

In the northern part of Tokyo for example, "NHK Urawa" transmitted from a broadcasting station in adjacent Saitama Prefecture on the north of Tokyo can be received in satisfactory conditions with relatively high sensitivity.

However, in the southern part of Tokyo, "NHK Urawa" is not receivable well with adequately high sensitivity due to the insufficient electric field intensity in reception.

Therefore, in an exemplary case where Japan is divided into unit areas of urban and rural prefectures and, as frequency data of the area "Tokyo", only the data of frequencies of broadcasting stations receivable with high certainty in any site of Tokyo are prepared in a data base of a ROM, it is impossible to tune in to "NHK Urawa" which is essentially receivable in the northern part of Tokyo.

Thus, when merely the data of frequencies of broadcasting stations receivable with high certainty in any of the divided areas are prepared in a data base as the frequency data for the individual areas, users living in the vicinity of the boundary of that area are rendered unable to listen to a broadcasting station which is to be essentially receivable in the neighboring prefecture.

Meanwhile in another case where data of frequencies of broadcasting stations receivable in any site of Tokyo are prepared in a data base as frequency data of the area "Tokyo", there arises a problem that "NHK Urawa", which is difficult to be received in the southern part of Tokyo, is preset. And if any broadcasting station difficult to be received is preset in this manner, the entire station selector keys are used before presetting the broadcasting stations which are to be receivable with high certainty, whereby the receivable broadcasting stations may fail to be preset in relation to the capacity of the memory.

More specifically, in case the frequency data of broadcasting stations receivable in any site of the divided area are prepared in the data base as frequency data of that area, there may occur a disadvantage that broadcasting stations difficult to be received are preset, whereas broadcasting stations receivable with certainty are not preset.

As mentioned, even if frequency data are prepared in the data base, there may arise a problem that, depending on geographic conditions of the site where the receiver is manipulated by an individual user, the frequency data in the data base cause inadequate preset.

SUMMARY OF THE INVENTION

It is therefore an object of the present invention to provide an improved synthesizer type receiver which is capable of solving the problems mentioned above.

According to one aspect of the present invention, there is provided a synthesizer type receiver wherein frequency conversion of a received signal is performed by the use of a signal formed in a PLL, and the frequency of the signal is changed through change of the frequency division ratio of a variable frequency divider in the PLL to thereby change the reception frequency. The receiver comprises a detector for detecting reception of a broadcast wave signal; a memory where data areas correspond respectively to a plurality of station selector keys; and a control unit including a data table with a data section relative to frequencies of broadcasting stations receivable in each of plural divided areas of the whole area where the receiver is used. In a preset mode, the reception frequency band is scanned by changing the frequency of the signal through change of the frequency division ratio. And when the reception frequency obtained at the time of detection of the broadcast wave signal by the detector during such scan is included in the frequency data in a preselected one of the divided areas in the data table, the data relative to the received frequency is stored in the data area of the memory, and the broadcasting station being currently received is preset in the station selection key corresponding to the data stored area in accordance with such storage.

In this synthesizer type receiver, broadcasting stations receivable practically with high certainty can be preset in the station selector keys out of the listed broadcasting stations whose data are registered previously in the data table. And even if there exist a plurality of stations where the respective frequencies are mutually different but the broadcast contents thereof are the same, merely one station alone is properly preset to consequently eliminate complication of the operation for selecting the desired station.

And out of such plural stations where the respective frequencies are mutually different but the broadcast contents thereof are the same, one station of the maximum reception level can be preset to thereby ensure a satisfactory state of reception.

Moreover, it becomes possible to preset even a non-register station whose data is not registered previously in the appropriate area of the data table.

In this case, any broadcasting station (register station) whose data is previously registered in the appropriate area of the data table can be preset with priority to any non-registered broadcasting station.

As a result, register stations are first preset and, if there is still an allowance in the station selector keys, a non-register station is preset next.

Because of the effects mentioned, it becomes possible to realize the intrinsic area call function required essentially for a stationary type receiver.

The above and other features and advantages of the present invention will become apparent from the following description which will be given with reference to the illustrative accompanying drawings.

BRIEF DESCRIPTION OF THE DRAWINGS

FIG. 4 shows an exemplary data table;

FIG. 5 shows an exemplary memory; and

FIGS. 6A to 6F are diagrams for schematically explaining the operation of the present invention.

DESCRIPTION OF THE PREFERRED EMBODIMENTS

Hereinafter the present invention will be described in detail with reference to some preferred embodiments thereof shown in the accompanying drawings.

Figure 1:
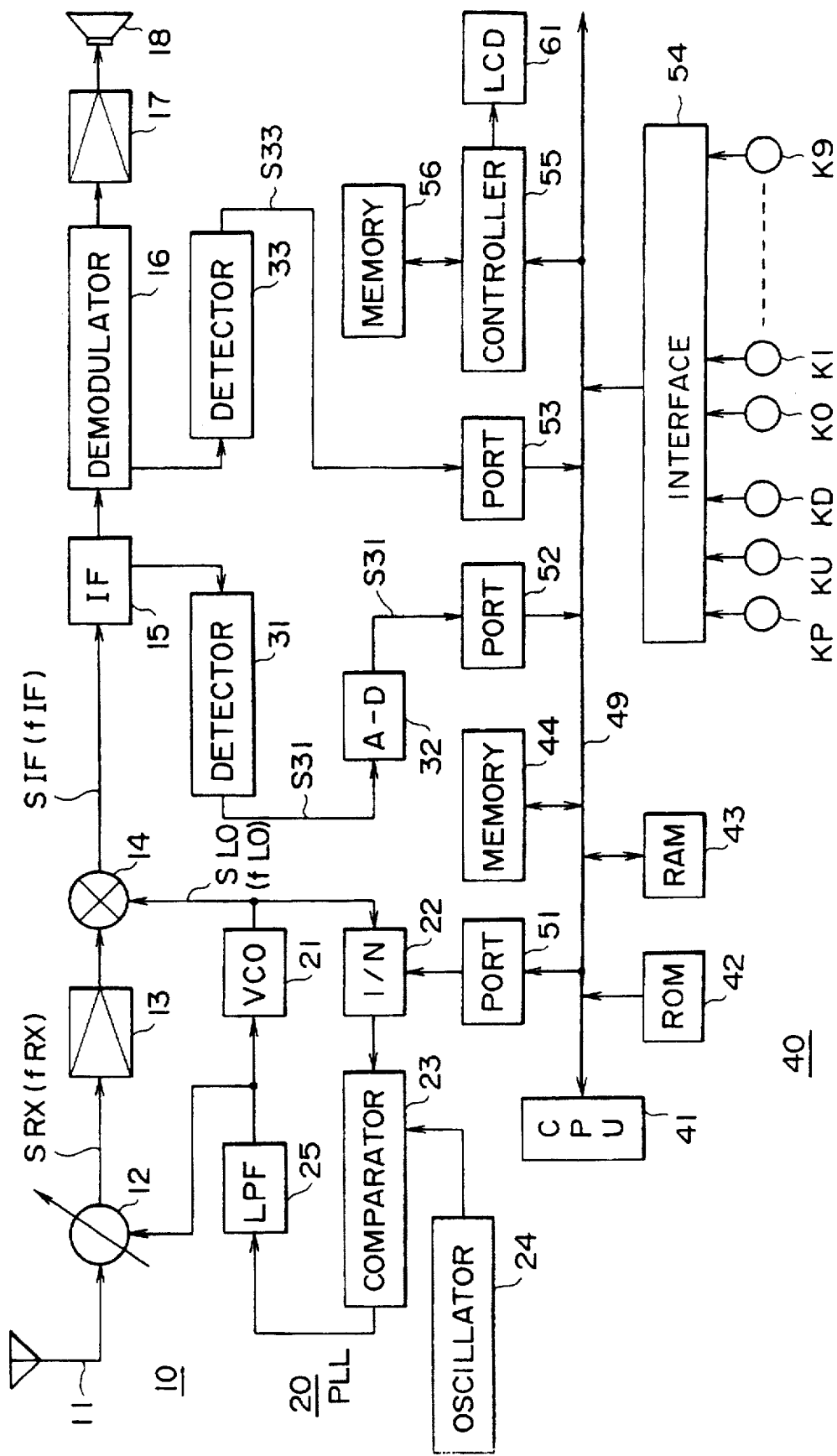
FIG. 1 is a block diagram showing an embodiment of the present invention.

FIG. 1 shows an exemplary case where the present invention is applied to an FM receiver, in which reference numeral 10 denotes an FM receiving circuit having a synthesizer configuration, and a signal received by an antenna 11 is supplied to an electronic-tuning type antenna tuner 12 so that a broadcast wave signal SRX of a desired frequency fRX is extracted.

Then the signal SRX is supplied via a high frequency amplifier 13 to a mixer 14, and an oscillation signal SL0 of a frequency fL0 is outputted from a VCO 21, where $$fL0 = fRX - fIF \text{ (kHz)} \quad (1)$$

in which fIF denotes an intermediate frequency of, e.g., 10.7 MHz. The signal SL0 is supplied as a local oscillation signal to the mixer 14, where the signal SRX is frequency-converted into an intermediate frequency signal SIF (intermediate frequency fIF).

Further the intermediate frequency signal SIF is supplied via an intermediate frequency amplifier 15 to an FM demodulator 16, and an audio signal demodulated therein is then supplied via an amplifier 17 to a loudspeaker 18.

In this configuration, the VCO 21 constitutes a PLL 20 together with the circuits 22 to 25. More specifically, the signal SL0 outputted from the VCO 21 is supplied to a variable frequency divider 22 where the frequency is divided into 1/N, and the frequency-divided signal thus obtained is supplied to a phase comparator 23, while an oscillation signal of a reference frequency such as 100 kHz is outputted from an oscillator 24 and then is supplied also to the phase comparator 23, whose comparison output is supplied via a low pass filter 25 to the VCO 21 as a control signal. Further, an output voltage of the filter 25 is supplied as a station selection voltage to the tuner 12.

Therefore, in a steady state, the frequency-divided signal Obtained from the frequency divider 22 and the oscillation signal from the oscillator 24 are equal in frequency to each other, so that the frequency fL0 of the oscillation signal SL0 at this time is expressed as $$fL0 = N \times 0.1 \text{ (MHz)} \quad (2)$$

From Eqs. (1) and (2), $$fRX = fL0 + fIF \quad (3)$$
$$= N \times 0.1 + 10.7 \text{ (MHz)}$$

Accordingly, if the frequency division ratio N is changed gradually in a unit of 1 between 653 and 793, then the local oscillation frequency fL0 is changed at an interval of 100 kHz between 65.3 MHz and 79.3 MHz, whereby the reception frequency fRX is changed at a frequency step of 100 kHz within a frequency band of 76.0 MHz to 90.0 MHz in accordance with the frequency division ratio N.

Further the intermediate frequency signal SIF outputted from the intermediate frequency amplifier 15 is partially supplied to a detector 31, which produces a DC signal S31 whose level changes correspondingly to the reception level of the broadcast wave signal SRX, i.e., a detection signal S31 representing the reception level of the broadcast wave signal SRX. Subsequently the detection signal S31 is supplied to an A-D converter 32, where analog-to-digital conversion is executed so that the analog detection signal S31 is converted into a digital detection signal S31.

Meanwhile the output of the demodulator 16 is partially supplied to a detector 33, which then produces a tuning detection signal S33 that becomes "1" at tuning in to the broadcast wave signal SRX or becomes "0" at non-tuning in thereto.

In addition to the above, this receiver is equipped with a microcomputer 40 which serves as a system controller. The microcomputer 40 employed in the embodiment is an 8-bit microcomputer μPD-78044 made by NEC Corporation. This microcomputer 40 includes a CPU 41, a program and data ROM 42, a work area RAM 43, and a preset memory 44. The memories 42–44 are connected to the CPU 41 via a system bus 49.

Figure 2:
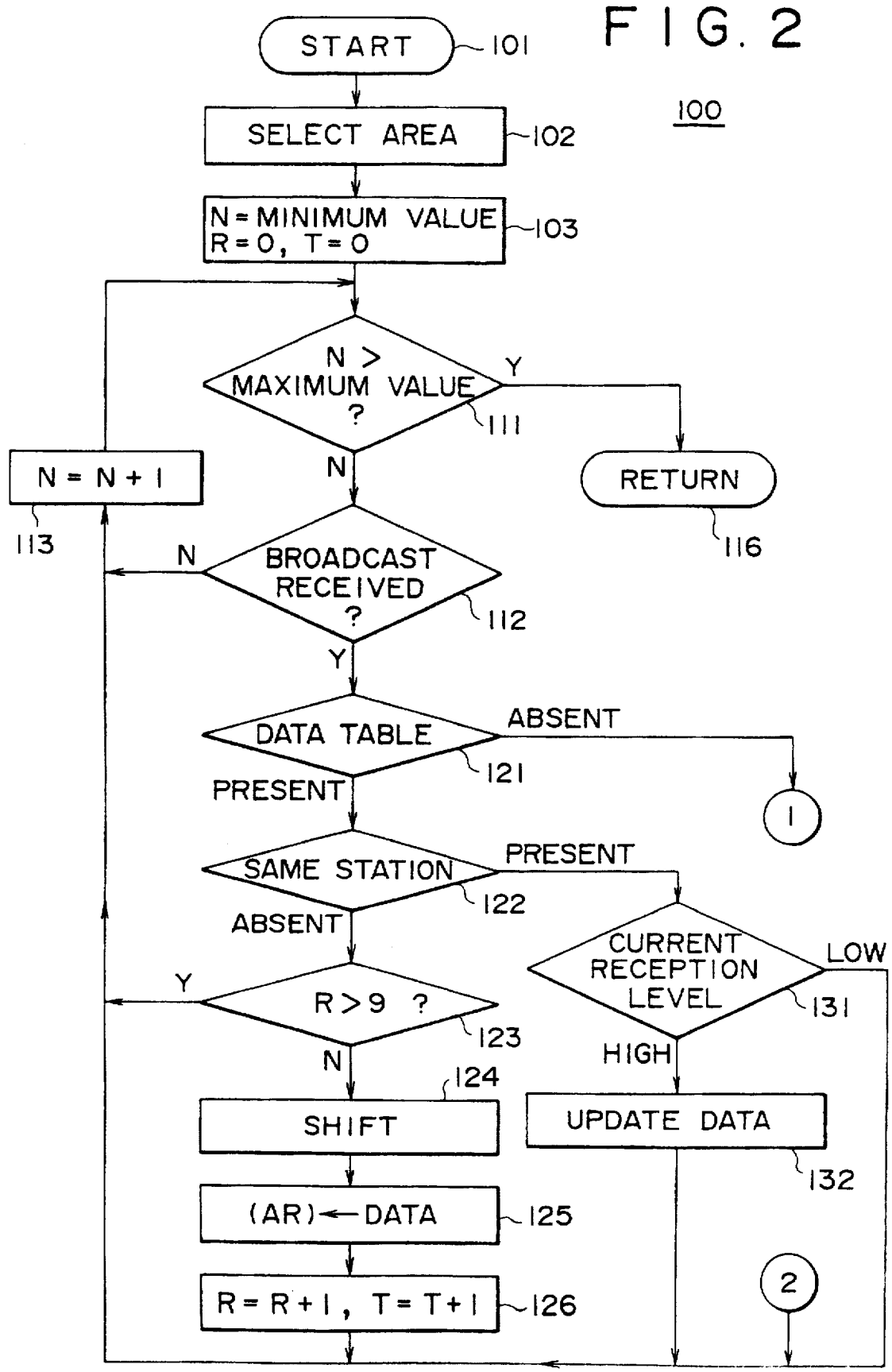
FIG. 2 is a flow chart of a partial routine executed in the embodiment of the invention.
Figure 3:
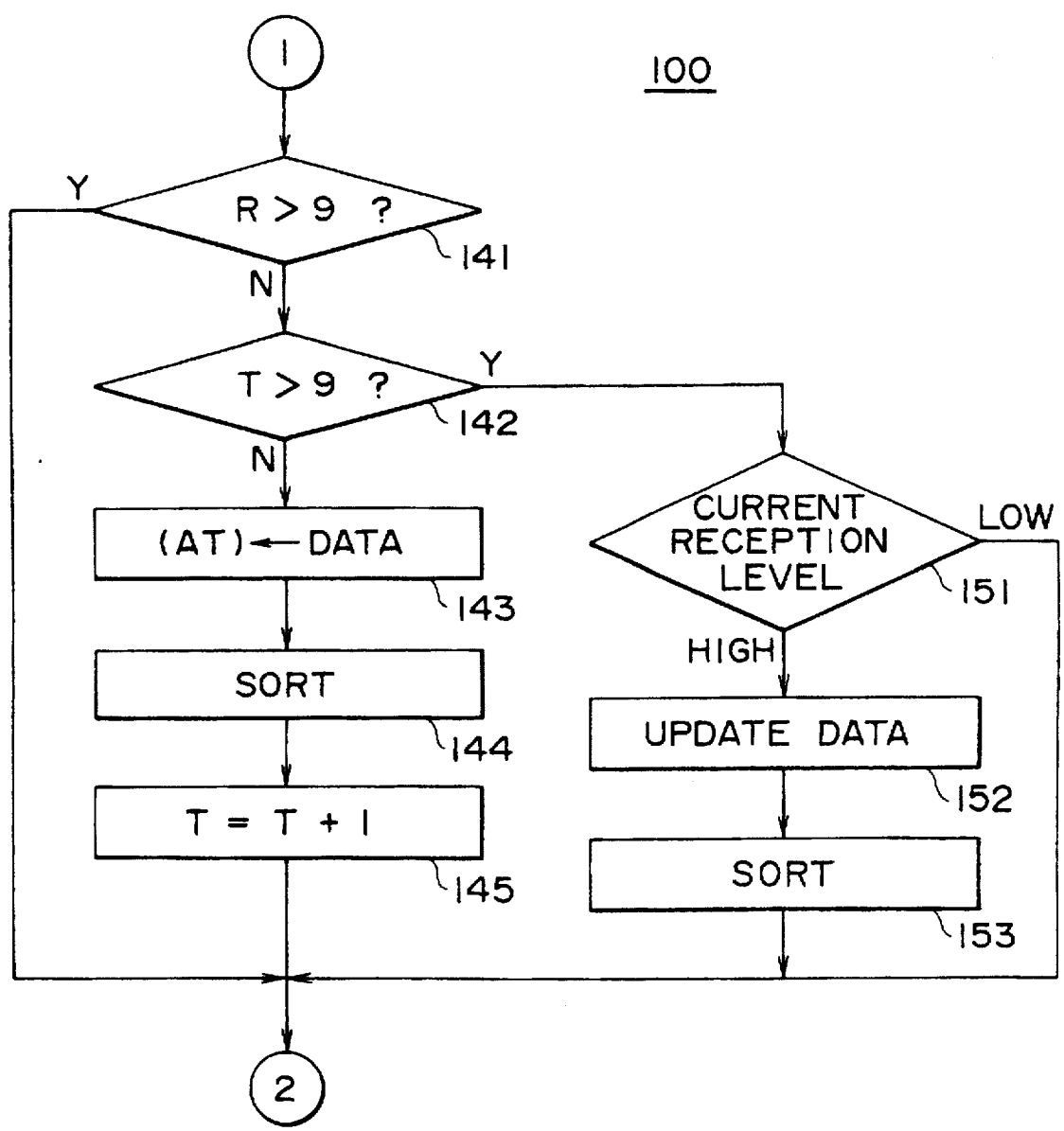
FIG. 3 is another flow chart of the routine continued from FIG. 2.

In this case, the ROM 42 has, as a portion programs written therein, a preset routine 100 shown in FIGS. 2 and 3 for example. This preset routine 100, which will be described in detail later, is adopted for presetting stations by area call.

The ROM 42 further has, as a data base of area call frequency data, a data table DTBL shown in FIG. 4 for example. In the data table of FIG. 4, Japan is divided into 47 areas in units of urban and rural prefectures.

The data table DTBL has, relative to each of the divided areas, data AN representing the relevant area name, and also has, per area, station name data SN of broadcasting stations which can be regarded, out of the entire FM stations receivable in that area, as the greatest common divisor (stations receivable with high certainty in any place of the relevant area, inclusive of repeater stations). The data table DTBL further has, per station name data SN, a frequency division ratio N as frequency data of that broadcasting station.

For example, the FM stations regarded as the greatest common divisor and receivable with high certainty in Tokyo include "University of Air" to "FM Yokohama", so that in the column of area "Tokyo", there are listed the data signifying the names of such broadcasting stations.

In the data table DTBL, numerals enclosed in parentheses denote frequencies fRX as references corresponding to the frequency division ratios N described on the left, and actually these numerals are not written in the table DTBL.

Register stations and non-register stations are defined as follows.

Register stations: Broadcasting stations whose name data are registered in the preset area out of the entire areas in the data table DTBL. (For example, when area "Tokyo" is a preset one in the table DTBL, the stations whose name data are registered in the column of "Tokyo", i.e., "University of Air"—"FM Yokohama".)

Non-register stations: Broadcasting stations whose name data are not registered in the preset area out of the entire areas in the data table DTBL. (For example, when area "Tokyo" is a preset one in the table DTBL, the stations whose name data are not registered in the column of "Tokyo", i.e., "NHK Urawa", etc.)

The memory 44 consists of a ROM where data can be erased or written electrically, or an unshown RAM backed up with a battery. That is, the memory 44 is a nonvolatile one and is capable of retaining the written data despite turn-off of its power supply.

As shown in FIG. 5 for example, the memory 44 has, e.g., data areas A0–A9 for ten stations correspondingly to undermentioned station selector keys K0–K9, and data of broadcasting stations to be preset in such keys K0–K9 are storable in the data areas A0–A9 respectively, wherein the data include frequency division ratios N, data SN representing the names of the broadcasting stations, and detection signals S31 each signifying the reception level of a broadcast wave signal SRX transmitted from the relevant broadcasting station.

Ports 51–53 and a key interface 54 are connected to the system bus 49. The port 51 is connected also to the frequency divider 22, so that the frequency division ratio N from the CPU 41 is set in the frequency divider 22 via the port 51. Meanwhile a detection signal S31 of the reception level from the A-D converter 32 is delivered to the microcomputer 40 via the port 52, and a tuning detection signal S33 from the detector 33 is delivered to the microcomputer 40 via the port 53.

To the interface 54, there are connected a preset key KP, an up key KU, a down key KD and station selector keys K0–K9 for ten stations. The station selection keys K0–K9 correspond respectively to the data areas A0–A9 in the memory 44. Each of the keys KP–K0 consists of a non-lock type push switch.

A display controller 55 is connected to the system bus 49, and a display memory 56 and a display element such as an LCD 61 are connected to the display controller 55. When display data are supplied from the CPU 41 to the controller 55, the data are written in the memory 56, and subsequently the written data are read out therefrom repeatedly by the controller 55 and then are supplied to the LCD 61, whereby characters and so forth corresponding to the data supplied to the controller 55 are displayed on the LCD 61.

In the configuration mentioned above, the respective operations are performed in the following manner according to the processing by the microcomputer 40.

Normal mode

In this mode where broadcast is received normally, it is also possible to select desired stations by using the station selector keys K0–K9.

When the station selector key Ki (i=one of 0 to 9), where a desired broadcasting station is preset out of the station selector keys K0–K9, is depressed during reception of any broadcast, the registered frequency division ratio N is read from the data area Ai corresponding to the depressed key Ki, out of the data area A0–A9 in the memory 44. Then the frequency division ratio N thus read is set in the variable frequency divider 22 via the port 51, and thereafter the receiving circuit 10 is tuned in to the reception frequency fRX corresponding to the set frequency division ratio N.

And simultaneously therewith, the station name data SN is also read out from the data area Ai, and then the data SN is supplied to the controller 55 so that the station name is displayed on the LCD 61. Further the frequency division ratio N read out from the data area Ai is converted, according to Eq. (3), into the data representing the reception frequency fRX. Subsequently the data representative of the reception frequency fRX is supplied to the controller 55, so that the reception frequency fRX is digitally displayed on the LCD 61. Similarly, the number i of the depressed station selector key Ki is digitally displayed on the LCD 61.

Thus, the broadcasting station preset in the station selector key Ki can be selected by depressing the key Ki. The name and the frequency of that broadcasting station are also displayed.

Preset mode

In this mode, receivable broadcasting stations are preset automatically in the station selector keys K0–K9.

FIGS. 6A to 6F show simplified examples of changes made in the contents of the data areas A0–A9 in the memory 44 at the preset time.

FM-A, FM-B, FM-C, FM-D, FM-E, FM-F, FM-G:
Names of register stations (and data thereof)
XX-0, XX-1, XX-2, XX-3:
Names of non-register stations (and data thereof)

The names of non-register stations are substituted with character strings signifying, e.g., the respective frequencies.

During a scan for presetting, as shown in FIG. 6A, station name data FM-A, FM-B, FM-C are registered in the data areas A0–A2 of the data table DTBL as register stations, and the station name data XX-1, XX-2 are registered in the succeeding data areas A3, A4 as non-register stations.

Suppose now that, with progress of the scan for presetting, one register station is receivable at a certain frequency and its station name is FM-D. Then, as shown in FIG. 6B, the station name data XX-1, XX-2 of the non-register stations, out of the entire station name data in the data table DTBL, are shifted backward (toward the greater-numbered data area) by an amount corresponding to one data area. And the data area A3, where the station name data XX-1 of the first non-register station has been stored until then, is rendered blank. (Practically the transferrer data is left even after transfer of the data, but the area is assumed here to be blank for simplifying the explanation.)

Subsequently, as shown in FIG. 6C, the station name data FM-D of the register station received now is written in the blank data area A3. Therefore, at this point of time, the station name data FM-A–FM-D of the register stations are registered in the preceding data areas A0–A3 of the table DTBL in the order of frequencies thereof, and the station name data XX-1, XX-2 of the non-register stations are registered in the succeeding data areas A4, A5.

Thereafter, the above process is executed repeatedly upon reception of each register station. In this case, however, the station name is checked, and if the received register stations have the same station name, the station of a higher reception level is registered.

Meanwhile, suppose that one non-register station is receivable at a certain frequency when the contents of the data table DTBL are such as those shown in FIG. 6A and that its station name is XX-3. Then, as shown in FIG. 6D, the station name data XX-3 of the non-register station received this time is registered in the data area A5 which is next to the data area A4 where, out of the entire station name data in the data table DTBL, the station name data XX-2 of the last non-register station is registered.

However, it is only when some of the data areas A0–A9 is blank that the station name data of the non-register station can thus be newly registered. Therefore, when any blank data area is not existent, the non-register station of the lowest reception level is deleted out of the non-register stations already registered and newly registered, so that registration of the remaining non-register stations is rendered effective. The non-register stations are registered after being sorted in the descending order from the highest reception level toward the lowest one, i.e., the non-register station of the highest reception level is registered in the youngest-numbered data area.

Consequently, if another register station is further received in the state of, e.g., FIG. 6E where the station name data FM-A–FM-G of register stations and the station name data XX-1–XX-3 of non-register stations have already been registered in the entire data areas A0–A9, the station name data XX-1–XX-3 of non-register stations are shifted as shown in FIG. 6F (similarly to the aforementioned case of FIG. 6B), so that the data XX-3 of the non-register station having the lowest reception level is deleted from the data area A9.

That is, when the data areas A0–A9 are full, the station name data of the non-register station is deleted, and the station name data of the newly received register station is registered. In this case, the non-register station, whose name data is deleted, is the one having the lowest reception level.

FIGS. 6A to 6F show merely the shifts of the station name data. Practically, however, there are also processed together the frequency division ratios N combined with such station name data, and the reception-level detection signals S31 as well.

The process mentioned above is realized by executing the preset routine 100 in the CPU 41. More specifically, if the preset key KP is continuously depressed for a relatively long time of, e.g., two seconds in a normal mode, this depression is detected by the CPU 41, so that the process of the CPU 41 starts from step 101 of the routine 100, and then proceeds to step 102.

When the up key KU is depressed at step 102, the area name data AN in the data table DTBL are read out successively in the regular order (downward from the top in FIG. 4), and then the area name data AN thus read out are supplied to the controller 55. Accordingly, the area names based on the data AN are displayed on the LCD 61 successively in the regular order with repeated depression of the up key KU.

Meanwhile, when the down key KD is depressed at step 102, the area name data AN in the data table DTBL are read out successively in the reverse order (upward from the bottom in FIG. 4), and then the area name data AN thus read out are supplied to the controller 55. Accordingly, the area names based on the data AN are displayed on the LCD 61 successively in the reverse order with repeated depression of the down key KD.

In this manner, when the key KU or KD is depressed, the area names are selected and displayed successively on the LCD 61. And if the key KP is depressed only for a short time upon display of the area name where the user is present now, the area name being displayed on the LCD 61 at that time is settled, and thereafter the station name data SN and the frequency division ratio N included in the column of that area name are determined to be processed.

For example, if the key KP is depressed for a short time when, e.g., "Tokyo" is being displayed on the LCD 61, "Tokyo" is selected, and thereafter the station name data SN and the frequency division ratios N included in the column of "Tokyo" are determined to be processed, i.e., "University of Air" . . . 664 to "FM Yokohama" . . . 740.

After settlement of the area name, the process proceeds from step 102 to step 103, where the frequency division ratio N of the variable frequency divider 22 is set to its minimum value of 653, so that the reception frequency fRX of the receiving circuit 10 is set to its lowest frequency 76.0 MHz. And simultaneously the pointers (counters) T and R are cleared to zero.

Pointer T: Total sum of preset broadcasting stations
Pointer R: Number of preset register stations Subsequently at step 111, a check is made as to whether the frequency division ratio N of the variable frequency divider 22 has exceeded the maximum value 793 or not. Since the result of this check is negative in this case, the process proceeds from step 111 to step 112.

Then at step 112, the tuning detection signal S33 supplied to the port 53 is checked to thereby make a decision as to whether the receiving circuit 10 is tuned in to the broadcast wave signal SRX or not. If the result of this decision signifies negative, the process proceeds from step 112 to step 113, where the frequency division ratio N of the variable frequency divider 22 is incremented by 1, and thereafter the process returns to step 111.

Consequently, steps 111–113 are executed repeatedly and, due to such repetition, the reception frequency fRX of the receiving circuit 10 is raised from the lowest frequency successively at an increase step of 100 kHz, i.e., a scan is started from the lowest frequency.

When the receiving circuit 10 is tuned in to the broadcast wave signal SRX at a certain frequency, this state is detected at step 112, and then the process proceeds from step 112 to step 121. Subsequently at step 121, a check is made as to whether the frequency fRX (frequency division ratio N) being received now is included or not in the area selected from the data table DTBL at step 102. And if the result of this check is affirmative, the process proceeds from step 121 to 122, where a decision is made as to whether any broadcasting station (repeater station) having the same name as that of the broadcasting station of the frequency fRX being received now has already been registered or not in any of the data areas A0–A9.

This decision can be realized by checking if the station name data SN of the broadcasting station being currently received (obtainable from the current frequency division ratio N with reference to the data table DTBL) is in any of the data areas A0–A9. For example, when the area is "Tokyo" and the received station is "FM-Fuji" of frequency 83.0 MHz, a decision can be executed by comparing the station name data SN of the received "FM-Fuji" with the station name data SN in the data areas A0–A9.

And when the result of such decision signifies that any broadcasting station having the same name as that of the broadcasting station of the frequency fRX being currently received is not registered previously in any of the data areas A0–A9, then the process proceeds from step 122 to step 123, where a check is made as to whether the condition of R>9 is satisfied or not, i.e., whether register stations have already been preset in the entire station selector keys K0–K9.

In case the condition of R>9 is not satisfied, i.e., when there exists any station selector key where none of register station is preset, the process proceeds from step 123 to step 124, where the data of non-register stations in the memory 44 are shifted as shown in FIG. 6B for example. More specifically, the data of non-register stations (frequency division ratios N, character strings representative of frequencies (substituting for station name data) and reception levels S31) in the (R+1)th data area AR to the Tth data area A(T−1) out of the entire data areas A0–A9 in the memory 44 are transferred toward the greater-numbered data areas respectively by an amount corresponding to one data area.

Subsequently the process proceeds to step 125, where the data of the register station being currently received (current frequency division ratio N, station name data of the register station being currently received, and detection signal S31 indicating the reception level of the broadcast wave signal SRX being currently received) are written and stored in the (R+1)th data area AR out of the entire data areas A0–A9 in the memory 44. It follows therefore that the register station being currently received is preset in the station selector key KR, which corresponds to the data area AR, out of the entire selector keys K0-K9.

Thereafter the process proceeds to step 126, where the pointers T and R are each incremented by 1, and then the process returns to step 113. Consequently, steps 111-126 are executed repeatedly.

Thus, according to steps 111-126, the FM broadcast band is scanned and, upon reception of the broadcast wave signal SRX from any register station prepared in the data table DTBL, the received register station is preset in one of the station selector keys K0-K9.

However, in case the newly received register station has already been preset in any of the station selector keys K0-K9, i.e., in case the data of one register station having the same name as that of the register station of the frequency fRX being currently received has already been registered in any data area Ax (x=one of 0 to 9) out of the entire data areas A0-A9, this state is detected at step 122, and then the process proceeds from step 122 to step 131.

At step 131, the detection signal S31 obtained from the A-D converter 32 is compared with the detection signal S31 stored in the data area Ax, whereby the reception level of the register station being currently received is compared with that of the register station stored in the data area Ax.

When the reception level of the register station being currently received is higher than that of the register station stored in the data area Ax, the process proceeds from step 131 to step 132, where the data of the register station being currently received (current frequency division ratio N, station name data SN of the register station being currently received, and detection signal S31 indicating the reception level of the broadcast wave signal SRX being currently received) are overwritten in the data area Ax. And thereafter the process returns to step 113.

However, when the reception level of the register station being currently received is lower than that of the register station stored in the data area Ax, the process proceeds from step 131 to step 113.

Accordingly, upon reception of any register station having the same name as that of the register station stored in the data area Ax, the data of one register station of the higher reception level, i.e., either the register station stored in the data area Ax, or the register station being currently received, is retained in the data area Ax.

In this manner, when any register station preset in one of the station selector keys K0-K9 has been received, either register station of the higher reception level is preset selectively, out of the register station already preset and the register station being currently received.

If the result of the check at step 123 signifies that the condition of R>9 is satisfied, it implies a case where register stations are preset in the entire station selector keys K0-K9, so that the process proceeds from step 123 to step 113, and the scan is continuously performed regardless of steps 124-126. Thus, even in the state where register stations have already been preset in the entire station selector keys K0-K9, such continuous scan is still performed to render steps 131 and 132 effective.

Meanwhile, in case the broadcast wave signal SRX is received at a certain frequency fRX during the scan but the frequency fRX is not registered previously in the appropriate area of the data table DTBL, i.e., when a non-register station is received, the process proceeds from step 121 to step 141. Then at step 141, a check is made as to whether the condition of R>9 is satisfied or not, i.e., whether register stations have already been preset in the entire station selector keys K0-K9.

If the condition of R>9 is satisfied, it implies that register stations are preset in the entire station selector keys K0-K9, so that the process returns from step 141 to step 113. Accordingly, in the case of R>9, any receivable non-register station is disregarded, and the FM broadcast band is scanned continuously.

However, if the result of the check at step 141 signifies that the condition of R>9 is not satisfied, i.e., when there is any station selector key where, out of the entire keys K0-K9, a register station is not preset, then the process proceeds from step 141 to step 142. And subsequently at step 142, another check is made as to whether the condition of T>9 is satisfied or not, i.e., whether register stations or non-register stations are preset in the entire station selector keys K0-K9.

If the condition of T>9 is not satisfied, i.e., when there is any station selector key where a register station or a non-register station is not preset, then the process proceeds from step 142 to step 143. Ant at step 143, the data of the current non-register station (frequency division ratio N, data of character string representative of the frequency (substituting for the data of broadcasting station name) and reception level S31) are written and stored in the (T+1)th data area AT out of the entire data areas A0-A9 in the memory 44.

Subsequently the process proceeds to step 144, where the data of non-register stations ranging, out of the entire data areas A0-A9, from the (R+1)th data area AR to the (T+1)th data area AT are sorted in the descending order of the reception levels indicated by the detection signals S31, i.e., in such an order that the data of the non-register station of the highest reception level corresponds to the youngest-numbered data area, and then the results of such sorting are written in the former data areas AR-AT.

Consequently, the non-register station being currently received is preset in the station selector key which, out of the entire keys K0-K9, corresponds to any one of the data areas AR-AT. At this time, the data of the non-register station of the lowest reception level is registered in the data area AT.

Next the process proceeds to step 145, where the pointer T is incremented by 1, and then the process returns to step 113. Accordingly, the FM broadcast band is continuously scanned thereafter.

Thus, upon reception of a non-register station when there exists any blank station selector key where, out of the entire keys K0-K9, neither register station nor non-register station is preset, then the received non-register station is preset in that key. And at this time, the non-register station of the lowest reception level is preset in the greatest-numbered station selector key out of the entire keys used for presetting.

Further, when broadcasting stations inclusive of both register and non-register stations have been preset in the entire station selector keys K0-K9 in accordance with the scan, the conditions of R>9 and T>9 are satisfied. And if any non-register station is received next in this state, the process proceeds from step 142 to step 151, where the reception level S31 of the non-register station being currently received is compared with the reception level S31 of the non-register station stored in the Tth data area A(T-1) out of the entire data areas A0-A9.

In case the reception level S31 of the non-register station being currently received is higher than the reception level S31 of the non-register station stored in the data area A(T-1), the process proceeds from step 151 to step. 152. Subsequently at step 152, the data of the non-register station being currently received (frequency division ratio N, data of character string representative of the frequency, and reception level S31) are overwritten and stored in the data area A(T-1).

Thereafter the process proceeds to step 153, where the data of non-register stations ranging, out of the entire data areas A0–A9, from the (R+1)th data area AR to the Tth data area A(T–1) are sorted in the descending order of the reception levels indicated by the detection signals S31, i.e., in such an order that the data of the non-register station of the highest reception level corresponds to the youngest-numbered data area, and then the results of such sorting are written in the former data areas AR–A(T–1). And thereafter the process returns to step 113.

If the result of the comparison at step 151 signifies that the reception level S31 of the non-register station being currently received is lower than the reception level S31 of the non-register station stored in the data area A(T–1), the process returns from step 151 to step 113 while skipping steps 152 and 153.

In this manner, when a non-register station is received in the state where both register and non-register stations have already been preset in the entire station selector keys K0–K9, new presetting is so performed as to delete the non-register station of the lowest reception level out of the received non-register station and the non-register stations registered in the station selector keys.

Thus, as mentioned, the FM broadcast band is scanned up to its maximum frequency of 90 MHz while register or non-register stations are preset. And when the frequency division ratio N has exceeded the maximum value 793 at step 113, it is detected at step 111, and then the process proceeds from step 111 to step 161 to thereby terminate the preset routine 100.

According to the FM receiver of FIG. 1, as described hereinabove, broadcasting stations receivable practically with high certainty can be preset in the station selector keys K0–K9 out of the listed broadcasting stations whose data are registered previously in the data table DTBL.

Further at step 122, even if there exist a plurality of stations where the respective frequencies are mutually different but the broadcast contents thereof are the same, merely one station alone is properly preset to consequently eliminate complication of the operation for selecting the desired station.

And out of such plural stations where the respective frequencies are mutually different but the broadcast contents thereof are the same, one station of the maximum reception level can be preset to thereby ensure a satisfactory state of reception.

Moreover, due to the process at step 143, it becomes possible to preset even a non-register station whose data is not registered previously in the appropriate area of the data table DTBL.

In this case, at steps 124 and 125, any broadcasting station (register station) whose data is previously registered in the appropriate area of the data table DTBL can be preset with priority to any non-registered broadcasting station.

As a result, register stations are first preset and, if there is still an allowance in the station selector keys K0–K9, a non-register station is preset next.

Because of the effects mentioned, it becomes possible to realize the intrinsic area call function required essentially for a stationary type receiver.

In the above embodiment, a preset mode is executed by depressing the preset key KP for, e.g., two seconds continuously. However, it may be so modified that a menu is displayed on the LCD 61 and a preset mode is selected from such a menu to be executed. Besides that, selection of a desired area at step 102 may be performed by means of a rotary encoder instead of using the up key KU and the down key KD.

Further in the above embodiment, when register and non-register stations are preset, data are written directly in the data areas A0–A9 at steps 125, 143 and so forth. However, the data may be written in the RAM 43 and, immediately before termination of the routine 100 at step 161, only the frequency division ratio N and the station name SN out of the entire data written in the RAM 43 may be transferred to the data areas A0–A9, whereby it is rendered possible to eliminate the necessity of preparing the area for the reception level S31 in the memory 44.

Also in the above embodiment, when there exist a plurality of stations whose broadcast contents are the same, one station of the higher reception level is preset in the station selector key in accordance with the detection signal S31 and the process at step 131. However, one broadcasting station in a better reception state can be preset by checking the multipath and so forth. Further, the tuning can be detected by using the detection signal S31 while omitting the detector 33.

Moreover, the above embodiment represents merely an exemplary case of receiving FM broadcast by the receiving circuit 10, and the same configuration may be employed in another case of receiving AM or television broadcast as well.

Although the present invention has been described hereinabove with reference to some preferred embodiments thereof, it is to be understood that the invention is not limited to such embodiments alone, and a variety of other changes and modifications will be apparent to those skilled in the art without departing from the spirit of the invention.

The scope of the invention, therefore, is to be determined solely by the appended claims.

What is claimed is:

1. A synthesizer type receiver wherein frequency conversion of a received signal is performed by the use of a signal formed in a phase locked loop (PLL), and the frequency of said signal is changed through change of the frequency division ratio of a variable frequency divider in said PLL to thereby change the reception frequency, said receiver comprising:

a detector for detecting reception of a broadcast wave signal;

a memory where data areas correspond respectively to a plurality of station selector keys; and a control unit having a data table with a data section relative to frequencies of broadcasting stations receivable in each of plural divided areas of the whole area where said receiver is to be used, said control unit being so constituted that, in a preset mode, the reception frequency band is scanned by changing the frequency of said signal through change of said frequency division ratio, and when the reception frequency at the time of detection of the broadcast wave signal by said detector during such scan is included in the frequency data in any preselected one of the divided areas in said data table, the data relative to the reception frequency is stored in the data area of said memory, and the broadcasting station being currently received is preset in a station selector key corresponding to a data stored area in accordance with such storage.

2. The receiver according to claim 1, wherein said control unit is so constituted that, in said preset mode, reception frequencies are scanned and, when said broadcast wave signal is detected by said detector during the scan and the reception frequency of said broadcast wave signal is included in the frequency data in any preselected one of the entire divided areas in said data table, the data of said detected signal is stored between the reception frequency data, which is included in the frequency data section in said preselected divided area of said data table already stored in the data area of said memory, and the reception frequency data which is not included in the frequency data section in said preselected divided area of said data table stored already in the data area of said memory, and the broadcasting station being currently received is preset in the station selector key corresponding to the data stored area in accordance with such storage.

3. The receiver according to claim 1, wherein said control unit is so constituted that, in said present mode, reception frequencies are scanned and, when said broadcast wave signal is detected by said detector during the scan and the reception frequency of said broadcast wave signal is not included in the frequency data in any preselected one of the entire divided areas in said data table, a check is made as to whether there is any data area where, out of the entire data areas in said memory, none of the station frequency data including said frequency data is stored, and if the result of such a check signifies that there is any data area where none of frequency data is stored, the data of the reception frequency is stored therein, and the broadcasting station being currently received is preset in the Station selector key corresponding to the data stored area in accordance with such storage.

4. The receiver according to claim 1, wherein said control unit has a data section relative to the frequencies, and a data table with a data section indicative of broadcast stations of said frequencies, said control unit being so constituted that, in said preset mode, the reception frequency band is scanned by changing the frequency of said signal through change of said frequency division ratio, and when the broadcast wave signal is detected by said detector during the scan, a decision is made as to whether the reception frequency at that time is included or not in the frequency data stored in any preselected one of the divided data areas in said data table, and if the result of such decision signifies that said frequency is included therein, the data area of said memory is checked to make another decision as to whether any broadcasting station having the same name as that of the station being currently received is preset or not in any of said station selector keys, and if the result of such another decision signifies that any broadcasting station of the same name is not preset in any station selector key, the data of the reception frequency is stored in the data area of said memory, and the broadcasting station being currently received is preset in the station selector key corresponding to the data stored area in accordance with such storage.

* * * * *